United States Patent [19]

Blount

[11] 4,047,015

[45] Sept. 6, 1977

[54] PHOTOFLASH ARRAY CONSTRUCTION

[75] Inventor: Richard Blount, South Euclid, Ohio

[73] Assignee: General Electric Company, Schenectady, N.Y.

[21] Appl. No.: 635,848

[22] Filed: Nov. 28, 1975

Related U.S. Application Data

[63] Continuation-in-part of Ser. No. 508,334, Sept. 23, 1974, abandoned.

[51] Int. Cl.$^2$ .............................................. G03B 15/02
[52] U.S. Cl. ...................................... 240/1.3; 354/127
[58] Field of Search ....................... 354/126, 127, 148; 240/1.3; 431/92, 93, 95 R

[56] References Cited

U.S. PATENT DOCUMENTS

| 2,868,958 | 1/1959 | Bounds | 240/1.3 |
|---|---|---|---|
| 3,458,270 | 7/1969 | Ganser et al. | 431/95 |
| 3,508,040 | 4/1970 | Bertrams et al. | 240/1.3 |
| 3,598,985 | 8/1971 | Harnden et al. | 240/1.3 |
| 3,608,451 | 9/1971 | Kelem | 240/1.3 X |
| 3,609,331 | 9/1971 | Fink et al. | 240/1.3 |
| 3,714,407 | 1/1973 | Bowers | 240/1.3 |
| 3,758,768 | 9/1973 | Secura | 240/1.3 |

FOREIGN PATENT DOCUMENTS

| 267,323 | 12/1968 | Austria | 240/1.3 |
|---|---|---|---|
| 1,942,465 | 2/1971 | Germany | 240/1.3 |

Primary Examiner—Fred L. Braun
Attorney, Agent, or Firm—Norman C. Fulmer; Lawrence R. Kempton; Frank L. Neuhauser

[57] ABSTRACT

Front and back housing members interlock together and contain between them a circuit board having a plurality of flash lamps attached thereto. A multiple reflector unit is positioned between the lamps and the circuit board to direct light from flashing lamps through the front housing member. The back housing member is transparent, and an indicia sheet is sandwiched between the back of the array and the circuit board and contains colored flash indicator dots, instructions, and/or other indicia visible through the back of the array.

8 Claims, 4 Drawing Figures

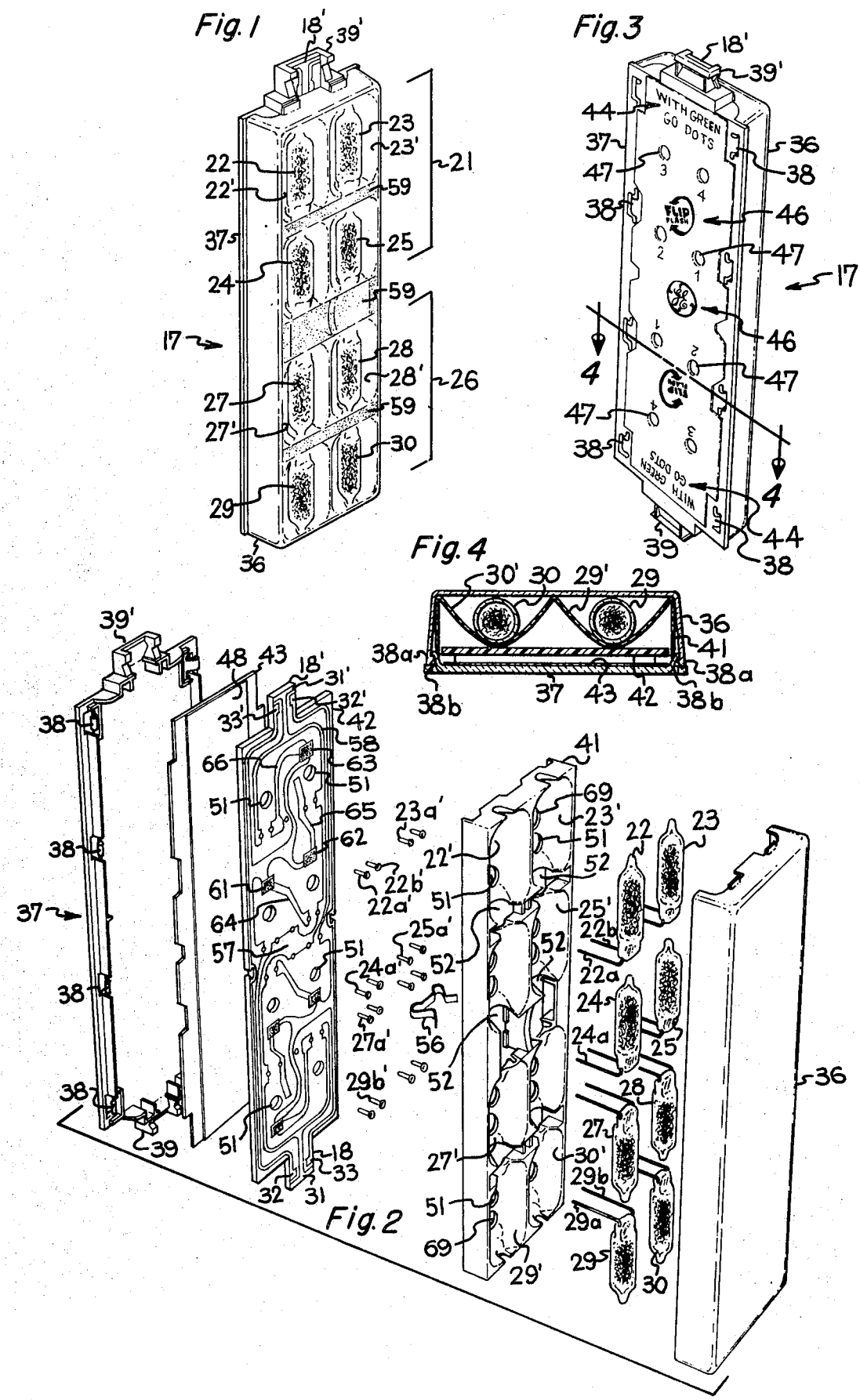

PHOTOFLASH ARRAY CONSTRUCTION

CROSS-REFERENCES TO RELATED APPLICATIONS

This is a continuation-in-part of patent application Ser. No. 508,334, filed Sept. 23, 1974, abandoned.

Ser. No. 448,671, filed Mar. 6, 1974, Kurt H. Weber, "Multiple Flash Lamp Unit", issued as U.S. Pat. No. 3,937,946 on Feb. 10, 1976 and assigned the same as this invention.

Ser. No. 485,459, filed July 3, 1974, Richard Blount, "Multiple Flash Lamp Unit," issued as U.S. Pat. No. 3,952,320 on Apr. 20, 1976 and assigned the same as this invention.

Ser. No. 485,422 filed July 3, 1974, Paul T. Coté, "Multiple Flash Lamp Unit," issued as U.S. Pat. No. 3,980,875 on Sept. 14, 1976 and assigned the same as this invention.

Ser. No. 485,460, filed July 3, 1974, Paul T. Coté, "Protective Terminal for Multiple Flash Lamp Unit," issued as U.S. Pat. No. 3,980,876 on Sept. 14, 1976 and assigned the same as this invention.

Ser. No. 499,316, filed Aug. 21, 1974, Paul T. Coté, "Connector for Photoflash Array," issued as U.S. Pat. No. 3,912,442 on Oct. 14, 1975 and assigned the same as this invention.

Ser. No. 523,564, filed Nov. 14, 1974, Robert M. Anderson, "Multiple Flashlamp Array," issued as U.S. Pat. No. 3,956,625 on May 11, 1976 and assigned the same as this invention.

BACKGROUND OF THE INVENTION

The invention is in the field of multiple photoflash lamp units, such as planar arrays.

U.S. Pat. Nos. 3,598,984 to Stanley Slomski and 3,598,985 to John Harnden and William Kornrumpf disclose a multiple flash array having first and second groups of flash lamps and reflectors facing in mutually opposite directions. The array is plugged into the camera whereby the first group of lamps faces frontwardly and is connected for the lamps of that group to be flashed. When these lamps have been flashed, the array is turned around and the lamps of the second group face frontwardly and are connected to be flashed. The lamps usually are flashed one at a time; however, a plurality of lamps can be flashed simultaneously if more light is desired.

These flash arrays, as well as other practical flash arrays disclosed in the patent literature, are constructed, as are conventional flashcubes, with the lamps attached to a base arrangement, and a transparent cover is positioned around the lamps with its open end attached to the base. Other proposed constructions have employed a concave rear housing member containing the flash lamps, with a flat front window member attached over the opening of the rear member.

The above-referenced patent applications disclose planar flash lamp arrays which may be advantageously constructed in accordance with the invention disclosed herein.

SUMMARY OF THE INVENTION

Objects of the invention are to provide an improved flash array construction and to provide such a construction that is feasible and economical to manufacture.

The invention comprises, briefly and in a preferred embodiment, a multiple flash lamp array having front and back housing members containing between them a circuit board having a plurality of flash lamps attached thereto. A multiple reflector unit is positioned between the lamps and the circuit board to direct light from the lamps through the front housing member when the lamps are flashed. Lead wires attached to the lamps extend rearwardly through openings in the reflector unit to connect the lamp to the circuit board. The back housing member is transparent, and an indicia sheet is sandwiched between the back of the array and the circuit board and contains colored flash indicator dots, instructions, and/or other indicia visible through the back of the array. When the lamps are flashed, the flash indicator dots change appearance in response to radiation being transmitted from the lamps and through openings in the reflector unit and the circuit board. The array can include features disclosed in the above-referenced patent applications, including lamp arrangement and connections so that the array can be attached to a camera in different orientations in each of which only a group of lamps relatively far away from the camera lens axis will be flashed, thereby reducing the likelihood of an undesirable "red-eye" effect which causes a person's pupils to appear red if the flashing lamp is close to the lens axis.

BRIEF DESCRIPTION OF THE DRAWING

FIG. 1 is a perspective view of a multiple flash lamp array in accordance with a preferred embodiment of the invention.

FIG. 2 is an exploded view of the array of FIG. 1 showing the internal parts.

FIG. 3 is a perspective view of the back of the array.

FIG. 4 is a sectional view taken on the line 4—4 of FIG. 3.

DESCRIPTION OF THE PREFERRED EMBODIMENT

A multiple flash lamp unit 17 of the planar array type and containing a plurality of electrically fired flash lamps is provided with a plug-in connector tab 18 at the lower side or end thereof, adapted to fit into a socket of a camera or flash adapter as shown and described in the above-referenced patent applications. The lamp array 17 is provided with a second plug-in connector tab 18' at the top side or end thereof, whereby the array 17 is adapted to be attached to the camera socket in either of two orientations, i.e., with either the tab 18 or the tab 18' plugged into the socket. The array 17 is provided with an upper group 21 of flash lamps 22, 23, 24, and 25, and a lower group 26 of flash lamps 27, 28, 29, and 30, the lamps being arranged in a planar configuration. Reflectors 22', etc., are disposed behind the respective flash lamps, so that as each lamp is flashed, its light is projected forwardly of the array 17. The lamps are arranged and connected so that when the array is connected to a camera by the connector 18, only the upper group 21 of lamps will be flashed, and when the array is turned end for end and connected to the camera by the other connector 18', only the then upper group 26 of lamps will be flashed. By this arrangement, only lamps relatively far from the lens axis are flashable, thus reducing the undesirable red-eye effect, as is more fully described in the above-referenced patent applications.

In accordance with the invention, the construction of the array comprises front and back housing members 36 and 37, which preferably are made of plastic and are provided with interlocking members 38 which can be molded integrally with the housing members and which lock the housing members together in final assembly to form a unitary flash array structure. FIG. 4 shows a pair of interlocking members 38a carried at the rear of the side of the front housing member 36 interlocked with a pair of interlocking members 38b of the back housing member 37. In the preferred embodiment shown, the front housing member 36 is a rectangular concavity and the back housing member 37 is substantially flat and includes integral extensions 39 and 39' at the ends thereof which partly surround and protect the connector tabs 18 and 18' and also function to facilitate mechanical attachment to the camera socket. Sandwiched between the front and back housing members 36 and 37, in the order named, are the flash lamps 22, etc., a unitary reflector member 41 (preferably of aluminum-coated plastic) shaped to provide the individual reflectors 22', etc., a printed circuit board 42 provided with integral connector tabs 18 and 18', and an indicia sheet 43 which may be provided with instructions, information 44, trademarks 46, and other indicia such as flash indicators 47 located behind the respective lamps and which change color or otherwise change in appearance due to heat and/or light radiation from a flashing lamp, thus indicating at a glance which of the lamps have been flashed and not flashed.

The indicia sheet 43 may be of paper or thin cardboard and provided with openings where the flash indicators 47 are desired, and flash indicator material 48, such as a sheet-like heat-sensitive plastic material, for example diaxially oriented polypropylene, which shrinks or melts when subjected to heat or radiant energy from an adjacent flashing lamp thus effectively changing the appearance or color of the openings in the indicia sheet 43. For example, the plastic material can be colored green on its back side by ink or other suitable means, and the green disappears and the opening becomes a different color (dark, for example) when the plastic shrinks or melts away due to heat from an adjacent flashing lamp. The front of the plastic (toward the lamps) should be coated with dark ink so as to absorb heat more readily. A single flash indicator sheet 48 may be arranged over all of the flash indicator openings. In keeping with the invention, window means which may be in the form of openings 51 are provided through the reflector unit 41 and the circuit board 42 to facilitate radiation from flashing lamps reaching the flash indicators 47. The rear housing member 37 is transparent (either of clear material or provided with window openings) to permit viewing of the indicia on the indicia sheet 43. The front housing member 36 is transparent at least in front of the lamps 22, etc., to permit light from flashing lamps to emerge frontwardly of the array, and may be tinted to alter the color of light from the flash lamps.

The height and width of the rectangular array are substantially greater than its thickness, and the heights and widths of the reflector member 41 and circuit board 42 are substantially the same as the interior height and width of the housing member 36, to facilitate holding the parts in place.

The tab 18, which is integral with the circuit board 42, is provided with a pair of electrical terminals 31 and 32, and similarly the tab 18' is provided with a pair of terminals 31' and 32', for contacting terminals of a camera socket for applying flash actuation signals such as firing voltage pulses to the array. Each tab is provided with a third terminal 33 and 33', respectively, which functions to electrically short the circuitry of the inactive lower group of lamps when the array is plugged into a socket, as is described in the above-referenced Blount patent application. The terminals 31 and 31' are shown as having a lateral "T-bar" configuration for temporarily shorting the socket terminals while the array is being plugged in, to discharge any residual voltage charge in the firing pulse source and also to reduce the likelihood of lamps being accidentally flashed by electrostatic voltage when the array is handled, as is disclosed in the above-referenced Coté patent application Ser. No. 485,460.

The circuit board 42 has a "printed circuit" thereon, as will be described, for causing sequential flashing of the lamps by firing voltage pulses applied to the terminals 31, 32 or 31', 32'. The top and bottom halves of the printed circuitry preferably are reverse mirror images of each other. The lead wires 22a, 22b, etc., of the lamps 22, etc., may be attached to the circuit board 42 in various ways, such as by means of metal eyelets 22a', 22b', etc., placed through openings in the board. Further in keeping with the invention, the lead wires 22a, 22b, etc., pass through openings 52 in the reflector member 41 and into or through the respective pairs of eyelets 22a', 22b', etc., and the ends of the eyelets are crimped or bent to hold the lead wires and make electrical contact thereto and also to hold the eyelets in place with their heads in electrical contact with the circuit of the circuit board. A metal clip 56 is clipped onto the reflector member 41, which is made of metal or metal-coated plastic, and the rear of the clip 56 rests against an area 57 of an electrical ground circuit run 58 on the board and which includes the terminals 31 and 31' and which makes contact with one of the connector eyelets 22a' or 22b', etc., for each of the lamps 22, etc.

Areas 59 on the transparent front housing member 36 may be made opaque or partly opaque, such as by making the surface roughened at these areas, to fully or partly conceal the lamp lead-in wires 22a, 22b, etc., and/or the lower portions of the lamps, for improved appearance of the array.

The circuit board terminal 32 is part of a conductor run that is electrically connected to lead-in wire 24a of lamp 24 at the eyelet 24a' and terminates at radiation switches 61, 62, and 63 respectively positioned near lamps 24, 25, and 23. A circuit board conductor run 64 is connected electrically to the remaining lead wire of flash lamp 25 at eyelet 25a, and terminates at the radiation switch 61. A circuit board conductor run 65 is connected to the remaining lead-in wire of flash lamp 23 at eyelet 23a' and terminates at the radiation switch 62. Similarly, a circuit board conductor run 66 is connected to the remaining lead-in wire of flash lamp 22 at eyelet 22b' and terminates at radiation switch 63.

The radiation switches 61, 62, and 63 are respectively in contact with and bridge across the circuit runs that are connected to them. The material for the radiation switches may be suitable material initially having an open circuit or high resistance, the resistance thereof becoming zero or a low value when the material receives radiation in the form of heat and/or light from a respective adjacent lamp, upon the lamp being flashed. For this purpose, each of the radiation switches is respectively positioned behind and near to a flash lamp 24, 25, 23. Window means in the form of transparent sections or openings 69 may be provided in the reflectors in front of the switches as shown in FIG. 2 to facilitate radiation transfer. Like the window means 69 in the reflectors, the window means 51 in the reflectors and circuit board in front of the flash indicators may be either transparent sections, or openings, or a combination thereof. The circuit board 42 can be of transparent plastic so as to provide the window means. "Transparent" is intended to mean that the window means are sufficiently transparent to radiation of flashing lamps so that sufficient radiation will pass therethrough to actuate the switches and/or flash indicators. Openings are the preferred form of the window means, so as to insure the transmission of sufficient radiation from flashing lamps to actuate any relatively less sensitive switches and flash indicators. A suitable material for the radiation switches is silver oxide dispersed in a binder such as polyvinyl resin. Each of these radiation switches, upon receiving heat and/or light radiation from the adjacent lamp when it is flashed, changes from an open circuit or high resistance to a closed circuit or low resistance between its switch terminals on the circuit board.

As has been explained, the lower portion of the circuit board contains a substantially reverse mirror image of the same circuit shown in the upper part of the circuit board, and therefore will not be described in detail. It will be noted that the circuit runs from the plugged-in terminals 31 and 32 at the lower part of the circuit board extend upwardly so as to activate the circuitry in the upper half of the circuit board. Similarly, when the unit is turned around and tab 18' is plugged into a socket, the circuit board terminals 31' and 32' will be connected to and activate the lamps which then will be in the upper half of the circuit board, and hence in the upper half of the flash unit 17. This accomplishes, as has been stated, the desirable characteristic whereby only the group of lamps relatively farthest away from the lens axis will be flashed, thereby reducing or eliminating the undesirable red-eye effect.

The circuit on the circuit board 42 functions as follows. Assuming that none of the four lamps in the upper half of the unit 17 have been flashed, upon occurrence of a first firing pulse applied across the terminals 31, 32, this pulse will be directly applied to the lead-in wires of the first-connected flash lamp 24, whereupon the lamp 24 flashes and becomes an open circuit between its lead-in wires. Heat and/or light radiation from the flashing first lamp 24 causes the adjacent radiation switch 61 to become a closed circuit (or a low value of resistance), thereby connecting the circuit board terminal 32 electrically to the lead-in wire of the second lamp 25 at eyelet 25a'. By the time this occurs, the firing pulse has diminished to a value insufficient to cause the second lamp 25 to flash. When the next firing pulse occurs, it is applied to the lead-in wires of the second lamp 25, via the now closed radiation switch 61, whereupon the second lamp 25 flashes, thereby causing radiation switch 62 to assume zero or low resistance, and the second lamp 25 now has an open circuit or high resistance between its lead-in wires. When the next firing pulse occurs, it is applied via now closed radiation switch 62 to the third lamp 23, thereby firing the lamp which becomes an open circuit, and the radiation from it causes the radiation switch 63 to become essentially a closed circuit across its terminals. Thus, the next firing pulse will be applied, via now closed radiation switch 63, to the lead-in wires of the fourth flash lamp 22, thereupon causing the lamp to flash. Since this lamp is the last lamp in the active circuit, it does not matter whether its lead-in wires are an open or closed circuit after flashing. Additional flash lamps, radiation switches, and electrical conductors can be employed, if desired, using the just described principles. When the flash unit is turned around and the other connector tab 18' is attached to the camera socket, the group of lamps that then becomes uppermost and relatively farthest away from the lens axis will be in an active circuit and will be flashed in the same manner as has been described. In a preferred embodiment, the lamps 22, etc., are high voltage types, requiring about 2000 volts at low current for flashing, and they are fired by impacting or stressing a piezoelectric element in the camera.

It has been found that the invention achieves its objective of providing a flash array construction that is feasible and economical to manufacture.

While preferred embodiments of the invention have been shown and described, various other embodiments and modifications thereof will become apparent to persons skilled in the art, and will fall within the scope of the invention as defined in the following claims.

What I claim as new and desire to secure by Letters Patent of the United States is:

1. A multiple flash lamp array comprising a housing having a front and a back, a plurality of flash lamps in a planar configuration and disposed within said housing adjacent the front thereof, reflector means positioned within said housing and having portions located behind said lamps to direct light from said lamps toward the front of said housing when said lamps are flashed, a circuit board positioned within said housing behind said lamps and said reflector means and having circuitry thereon for causing flashing of said lamps in response to the transmission of flash actuation signals to said circuitry, openings through the back of said reflector means, leads on said lamps and extending rearwardly through said openings into electrical contact with said circuitry, said front of said housing being transparent at least in front of said lamps to permit passage of light from the lamps when the latter are flashed, and an indicia sheet located within said housing between said circuit board and said back of said housing, said indicia sheet containing flash indicator means thereon facing the back of said housing, said back of said housing being transparent at least in part to permit viewing of said flash indicator means, and means for actuating said flash indicator means in response to the flashing of said flash lamps, said flash indicator means being visible from behind said array for indicating the flashing of lamps which project light from the front of said array.

2. An array as claimed in claim 1, in which said flash indicator means comprises material positioned adjacent to the respective lamps and which changes in appearance in response to radiation from the respective adjacent lamps when flashed.

3. An array as claimed in claim 2, in which said circuit board and said reflector means are provided with window means between said lamps and the respective said adjacent material.

4. An array as claimed in claim 3, in which said window means comprises openings.

5. An array as claimed in claim 3, in which said material comprises heat-sensitive plastic.

6. A multiple flash lamp array comprising a housing having a front and a back, said front and said back each being transparent at least in part, a plurality of flash lamps in a planar configuration and disposed within said housing adjacent the front thereof, reflector means positioned within said housing and having portions located behind said lamps to direct light from said lamps toward the front of said housing when said lamps are flashed, a circuit board positioned within said housing behind said lamps and said reflector means and having circuitry thereon connected to said lamps for causing flashing of said lamps in response to the transmission of flash actuation signals to said circuitry, window means in said reflector means and said circuit board adjacent each of said lamps, an indicia sheet disposed within said housing between said circuit board and said back of said housing, and flash indicators on said indicia sheet adjacent each of said lamps and each changing appearance in response to the transmission of radiation from the adjacent lamp through the adjacent window means in said reflector means and said circuit board when the adjacent lamp is flashed.

7. An array as claimed in claim 6, in which said window means comprises openings.

8. An array as claimed in claim 6, in which said flash indicators comprise heat-sensitive plastic.

* * * * *